(12) United States Patent
Anderson

(10) Patent No.: US 7,522,121 B2
(45) Date of Patent: Apr. 21, 2009

(54) METHOD FOR FABRICATING AN ANTENNA

(75) Inventor: Peter Traneus Anderson, Andover, MA (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 11/133,046

(22) Filed: May 19, 2005

(65) Prior Publication Data

US 2006/0262029 A1 Nov. 23, 2006

(51) Int. Cl.
*H01Q 1/36* (2006.01)
(52) U.S. Cl. .................. 343/895; 343/700 MS
(58) Field of Classification Search .......... 343/895, 343/897, 700 MS, 718
See application file for complete search history.

(56) References Cited

U.S. PATENT DOCUMENTS

| | | | | |
|---|---|---|---|---|
| 3,998,173 A | * | 12/1976 | Williamson et al. | 343/898 |
| 4,373,458 A | * | 2/1983 | Dorosz et al. | 112/470.06 |
| 4,631,100 A | | 12/1986 | Pellegrino | |
| 4,785,752 A | * | 11/1988 | Soma | 112/278 |
| 5,453,686 A | | 9/1995 | Anderson | |
| 5,640,170 A | | 6/1997 | Anderson | |
| 6,073,043 A | | 6/2000 | Schneider | |
| 6,590,540 B1 | * | 7/2003 | Adams et al. | 343/718 |
| 6,603,403 B2 | * | 8/2003 | Jeutter et al. | 340/604 |
| 6,677,917 B2 | * | 1/2004 | Van Heerden et al. | 343/897 |
| 6,774,624 B2 | | 8/2004 | Anderson et al. | |
| 6,867,740 B2 | * | 3/2005 | Goodyear | 343/718 |
| 6,992,636 B2 | * | 1/2006 | Tebbe et al. | 343/700 MS |
| 2004/0130500 A1 | * | 7/2004 | Takei | 343/895 |
| 2004/0252847 A1 | * | 12/2004 | Bassett | 381/77 |
| 2005/0072595 A1 | * | 4/2005 | Cho | 174/260 |
| 2005/0235482 A1 | * | 10/2005 | Deaett et al. | 29/600 |

FOREIGN PATENT DOCUMENTS

JP 2002 298110 * 11/2002

* cited by examiner

*Primary Examiner*—Trinh V Dinh
(74) *Attorney, Agent, or Firm*—The Small Patent Law Group; Dean D. Small

(57) ABSTRACT

Various methods for fabricating an antenna are provided. The methods include stitching an antenna pattern onto a substrate where the stitching incorporates a wire.

7 Claims, 8 Drawing Sheets

METHOD FOR FABRICATING AN ANTENNA

BACKGROUND OF THE INVENTION

This invention relates generally to electromagnetic tracking systems, and more particularly, to a method for fabricating an antenna used in an electromagnetic tracking system.

Electromagnetic tracking systems use electromagnetic fields for tracking changes in the position of a surgical device. These electromagnetic tracking systems use coils for generating and sensing the electromagnetic field, and a processor to ascertain the position of the surgical device.

In known electromagnetic tracking systems, printed circuit boards (PCB) with an array of coils etched on the surface are used. However, the size of the PCB limits the size of the array of coils that can be used in the electromagnetic tracking systems.

BRIEF DESCRIPTION OF THE INVENTION

In an exemplary embodiment of the invention, a method for fabricating an antenna is provided. The method includes stitching an antenna pattern onto a substrate. The antenna pattern incorporates a wire.

In another exemplary embodiment of the invention, an antenna is provided. The antenna includes a substrate, an antenna pattern and a wire. The antenna pattern is stitched on to the substrate by using a sewing machine; and the wire is attached to the substrate, using the sewing machine. The wire is provided to a bobbin of the sewing machine and the shape of the wire is defined by the antenna pattern.

DETAILED DESCRIPTION OF THE INVENTION

Various embodiments of the invention provide a method for fabricating an antenna, which is used in an electromagnetic tracking system.

Figure 1:
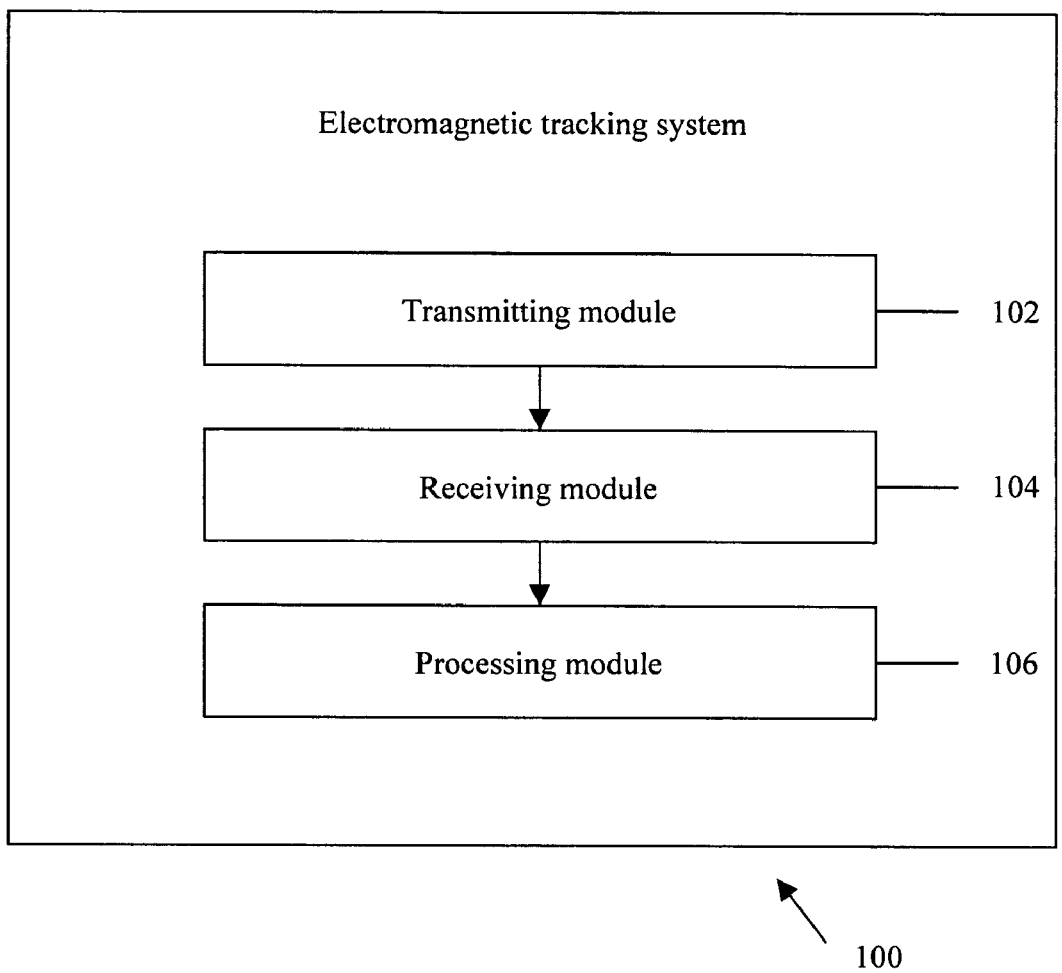
FIG. 1 is a block diagram of an electromagnetic tracking system, in which various embodiments of the invention can be implemented.

FIG. 1 is a block diagram of an electromagnetic tracking system 100, in which various embodiments of the invention can be implemented. Electromagnetic tracking system 100 includes a transmitting module 102, a receiving module 104, and a processing module 106. Electromagnetic tracking system 100 uses electromagnetic fields to track surgical devices used in surgical navigation and intervention. In an exemplary embodiment of the invention, the surgical device may be a catheter.

Transmitting module 102 generates and transmits a plurality of distinguishable electromagnetic fields, depending upon the number of coils in transmitting module 102. In an embodiment of the invention, transmitting module 102 may be attached to the surgical device.

Receiving module 104 receives the electromagnetic fields generated by transmitting module 102. Receiving module 104 may include one or more coils for sensing the transmitted electromagnetic fields. Receiving module 104 is also connected to processing module 106, which establishes the location of the surgical device by first making a rough estimate of the position of the surgical device, and then tracking the changes in the position of the surgical device with respect to the initial estimate of the position. For tracking changes in the position of the surgical device, processing module 106 calculates the mutual inductance between each coil of transmitting module 102 and receiving module 104. The mutual inductance is an electrical property between two materials that can be measured and may be used to determine the position and orientation of one material with respect to another. The position and orientation of the surgical device can be obtained in up to six degrees of freedom, depending on the number of coils in transmitting module 102 and receiving module 104. Processing module 106 may be a software module incorporated in a computer or a processor. The coil used in transmitting module 102, and/or receiving module 104 may be referred to as an antenna.

Figure 2:
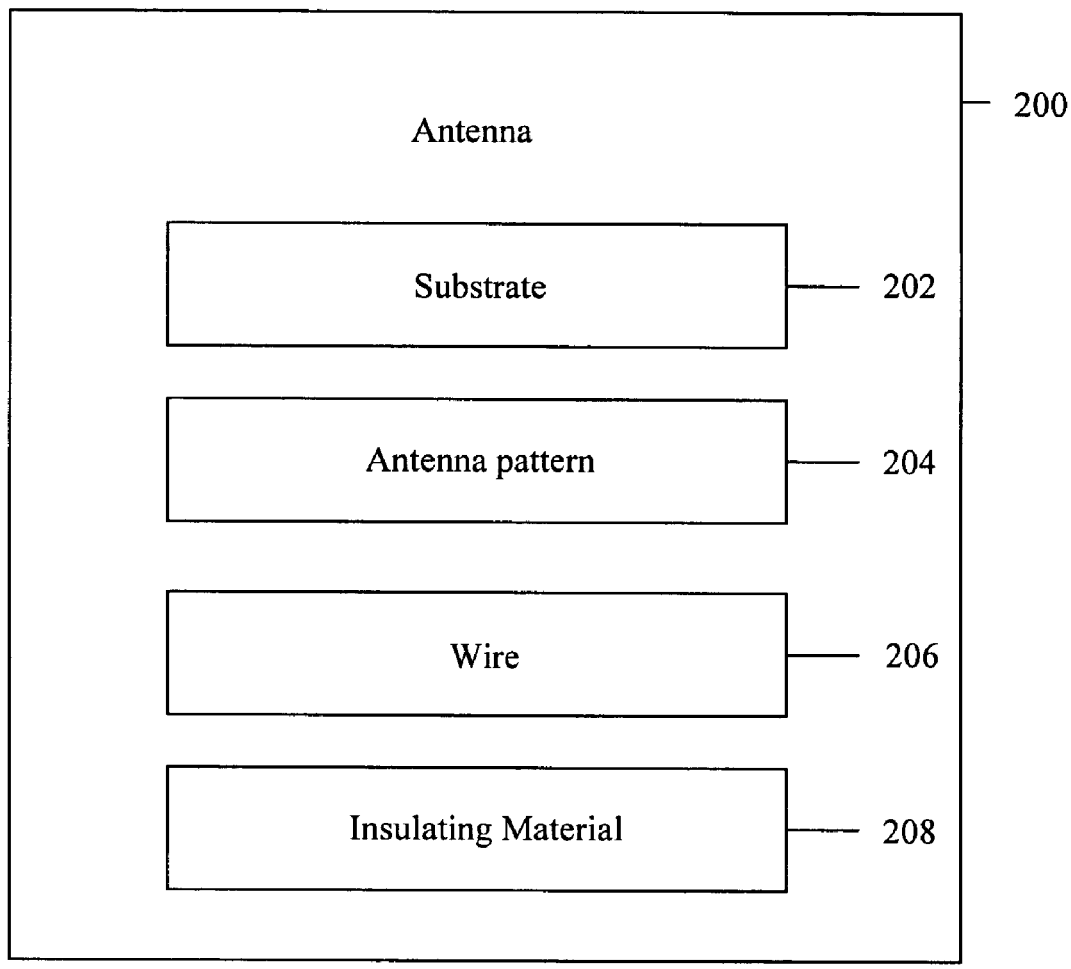
FIG. 2 is a block diagram of an antenna, in accordance with an embodiment of the invention.

FIG. 2 is a block diagram of an antenna 200, in accordance with an embodiment of the invention. Antenna 200 includes a substrate 202, an antenna pattern 204, and a wire 206.

Substrate 202 provides a platform for antenna pattern 204 and wire 206. In an embodiment of the invention, substrate 202 may be a rigid substrate configured for perforation by a needle of a sewing machine. In another embodiment of the invention, substrate 202 may be a flexible substrate. In yet another embodiment of the invention, substrate 202 may be a pre-perforated substrate. In another embodiment of the invention, substrate 202 may be a conformal substrate. Substrate 202 may be, for example, but not limited to, a cloth, a cardboard, a metal, a ceramic, a composite material or an alloy.

Substrate 202 has antenna pattern 204 stitched on its surface. Antenna pattern 204 is stitched by using a sewing machine, and may be a pre-defined shape or a shape based on a mathematical model. In an exemplary embodiment of the invention, antenna pattern 204 may be a two dimensional pattern. In an embodiment of the invention, the two dimensional pattern is a spiral coil pattern. In another embodiment of the invention, the two dimensional pattern may be a rectangular or an oval pattern.

Figure 3:
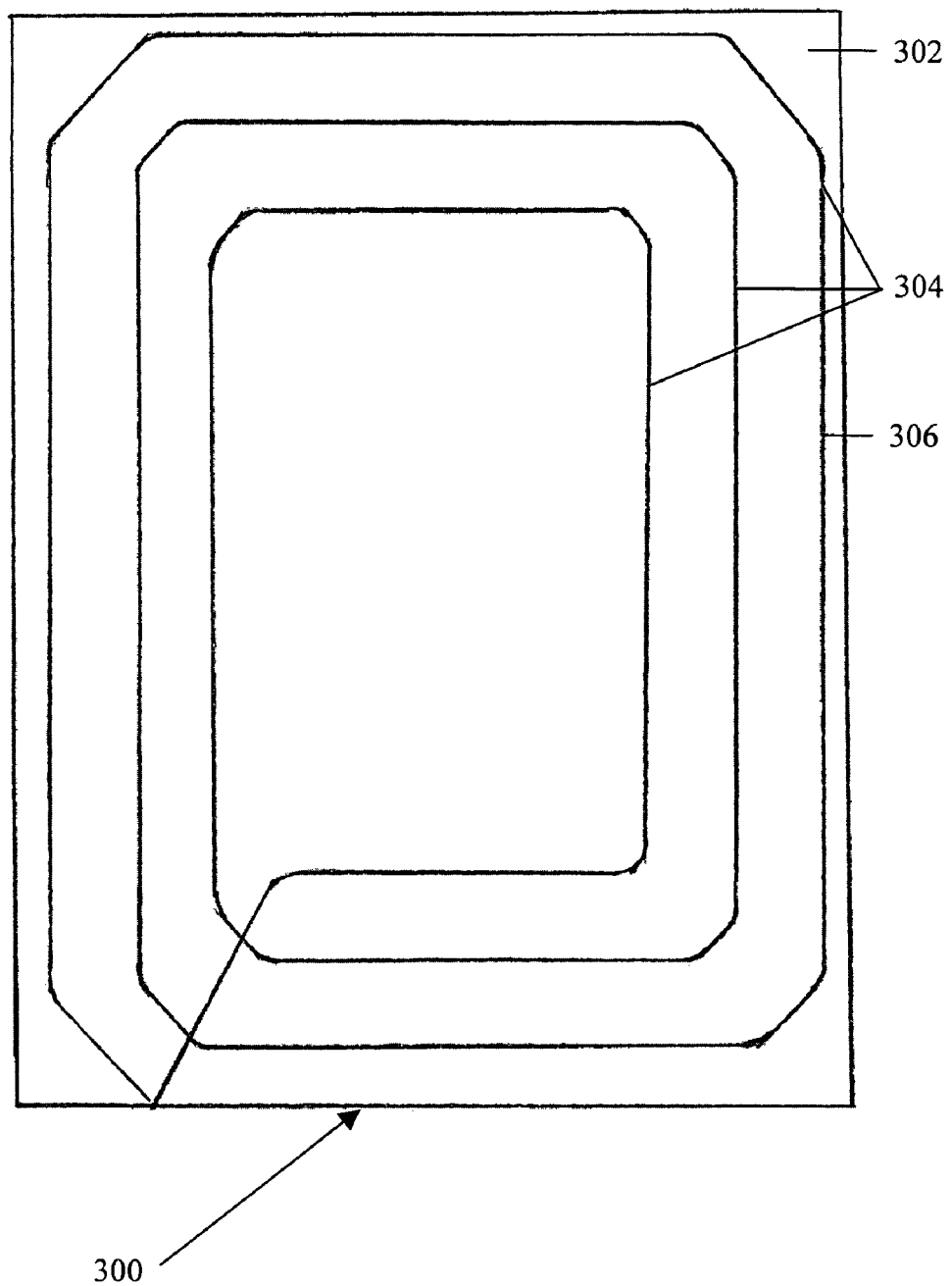
FIG. 3 depicts a front surface of a substrate of an antenna, in accordance with an exemplary embodiment of the invention.
Figure 4:
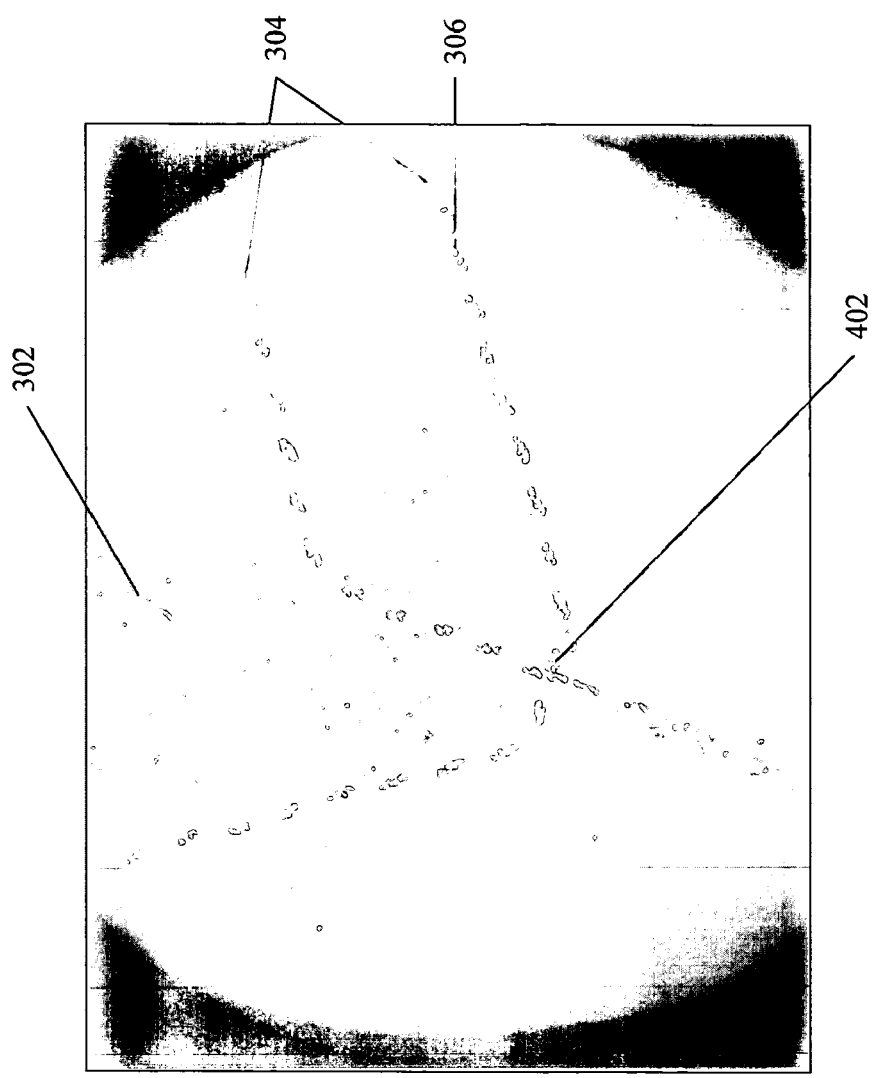
FIG. 4 depicts an enlarged view of the front surface of a substrate of an antenna, in accordance with an exemplary embodiment of the invention

Antenna pattern 204 incorporates wire 206, which is attached to substrate 202 using the sewing machine. In an embodiment of the invention, a length of wire 206 is provided from a bobbin of the sewing machine. As used herein, the bobbin generally refers to a spool or reel that provides a second source of material to be stitched by a sewing machine. As wire 206 is provided from the bobbin, wire 206 conforms to the pre-defined shape or a shape based on the mathematical model of antenna pattern 204. An example of antenna pattern 204 is illustrated in FIG. 3 and FIG. 4. Wire 206 may be a material that is capable of carrying current, and may be, for example, but not limited to, copper, aluminum or copper-coated steel wire.

In various embodiments of the invention, antenna 200 further includes an insulating material 208, which is stitched onto substrate 202. In an embodiment of the invention, insulating material 208 is stitched onto substrate 202 and extends across antenna pattern 204. In another embodiment of the invention, insulating material 208 extends across at least a portion of wire 206, stitched in confirmation with antenna pattern 204. Further, a portion of wire 206 extends across insulating material 208 to provide a lead for antenna 200. This has further been illustrated in FIG. 4. Insulating material 208 may be, for example, but not limited to, a cloth, a cardboard, a ceramic, a composite material or an alloy.

FIG. 3 depicts a front surface of a substrate 302 of an antenna 300, in accordance with an exemplary embodiment of the invention. Substrate 302 is fabricated from any number of materials used as substrates and has an antenna pattern 304 stitched on the surface. Antenna pattern 304 is a three turn rectangular spiral and is stitched on substrate 302 using the sewing machine. The sewing machine provides a thread 306 from the needle. Thread 306 is stitched on the front surface of substrate 302. An enlarged view of the front surface has been illustrated in FIG. 4. As thread 306 is provided from the needle, thread 306 substantially conforms to antenna pattern 304.

FIG. 4 depicts an enlarged view of the front surface of substrate 302 of antenna 300, in accordance with an exemplary embodiment of the invention. Substrate 302 is fabricated from any number of materials used as substrates and has an antenna pattern 304 stitched on the surface. FIG. 4 shows only a part of antenna pattern 304 stitched on substrate 302 using the sewing machine. The sewing machine provides thread 306 from the needle. Thread 306 is stitched on the front surface of substrate 302. A part of thread 306, which exits an area interior of antenna pattern 304, crosses over a turn 402 of antenna pattern 304.

Figure 5:
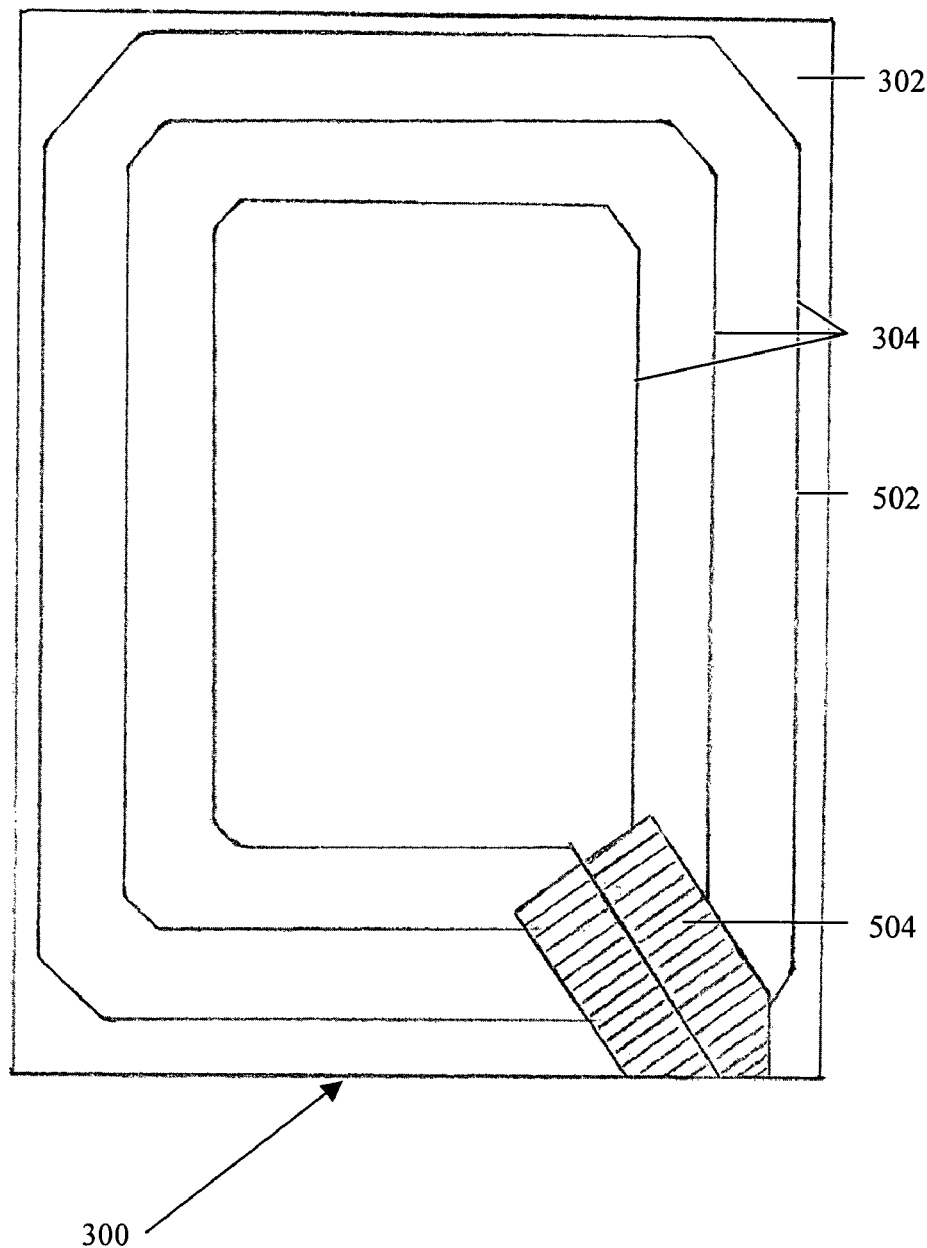
FIG. 5 depicts a back surface of a substrate of an antenna, in accordance with an exemplary embodiment of the invention.

FIG. 5 depicts a back surface of substrate 302 of antenna 300, in accordance with an exemplary embodiment of the invention. Substrate 302 has a wire 502 attached to the back surface by stitches. Wire 502 is held on to the back surface of substrate 302 by thread 306 by operation of the sewing machine. An enlarged view of the back surface has been illustrated in FIG. 6. As wire 502 is provided from the bobbin, wire 502 is shaped to form to antenna pattern 304. Further, a part of wire 502 exits an interior area of antenna pattern 304 to provide a lead for antenna 300. The part of wire 502 that exits antenna pattern 304 is insulated from a part of wire 502 stitched in conformation with antenna pattern 304 by an insulating material 504. Insulating material 504 extends across a part of antenna pattern 304.

Figure 6:
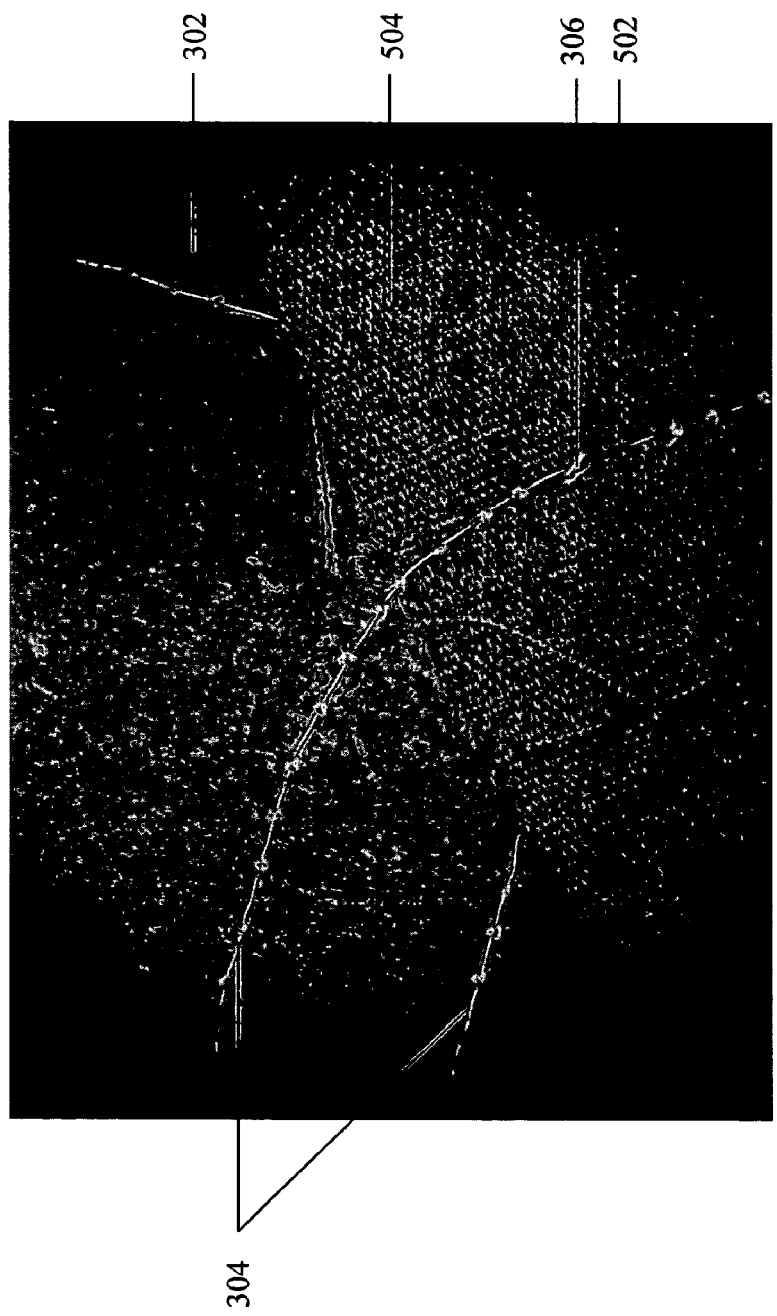
FIG. 6 depicts an enlarged view of the back surface of substrate of an antenna, in accordance with an exemplary embodiment of the invention

FIG. 6 depicts an enlarged view of the back surface of substrate 302 of antenna 300, in accordance with an exemplary embodiment of the invention. Substrate 302 has wire 502 attached to the back surface by stitches. As thread 306 is provided from the needle, thread 306 goes through substrate 302 and loops around wire 502, provided from the bobbin. Hence, wire 502 is held on to the back surface of substrate 302 by thread 306 by operation of the sewing machine. Further, a part of wire 502 exits an interior area of antenna pattern 304 to provide a lead for antenna 300. The part of wire 502 that exits antenna pattern 304 is insulated from a part of wire 502 stitched in conformation with antenna pattern 304 by an insulating material 504. Insulating material 504 extends across turn 402, hidden by insulating material 504, to insulate turn 402 from the part of wire that exits an interior area of antenna pattern 304.

In various embodiments of the invention, a method for fabricating an antenna 200 is provided. The method for fabricating the antenna includes stitching antenna pattern 204 on to substrate 202. Antenna pattern 204 incorporates wire 206.

Figure 7:
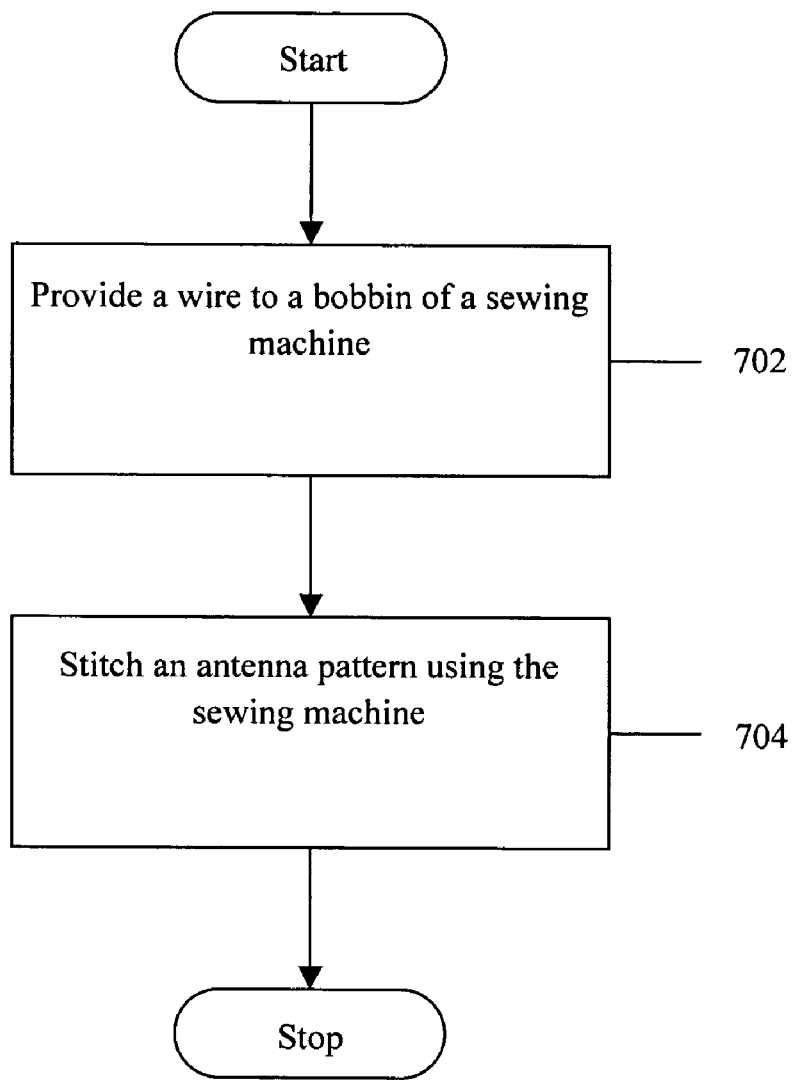
FIG. 7 is a flowchart of a method for stitching an antenna pattern, in accordance with an embodiment of the invention.

FIG. 7 is a flowchart of a method for stitching antenna pattern 204, in accordance with an embodiment of the invention. At 702, wire 206 is provided to a bobbin of a sewing machine. The bobbin is located below the sewing plane of the sewing machine. In one known sewing machine, the material housed in the bobbin makes only one sharp turn (e.g., about 90 degrees) while reaching the sewing plane from the bobbin. Therefore wire 206 may be used in the bobbin without concern that the wire 206 may be broken by the action of the stitching mechanism of the sewing machine. At 704, wire 206 is stitched, according to antenna pattern 204, on to substrate 202 by using the sewing machine.

Figure 8:
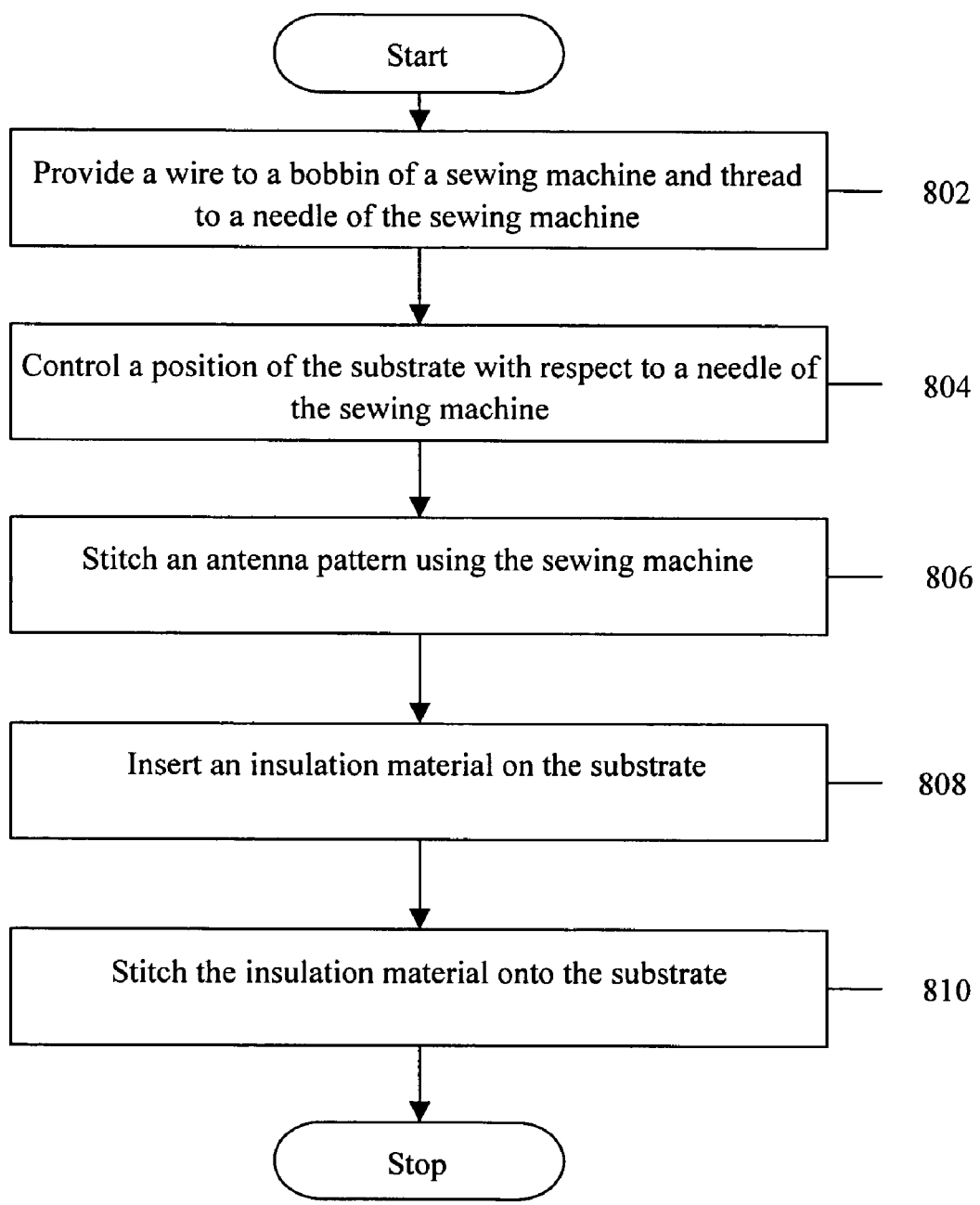
FIG. 8 is a flowchart of a method for fabricating an antenna, in accordance with an embodiment of the invention.

FIG. 8 is a flowchart of a method for fabricating an antenna, in accordance with an embodiment of the invention. At 802, wire 206 is provided to a bobbin of a sewing machine and a thread is provided to a needle of the sewing machine. The thread may be, for example, but not limited to, a cotton thread, a nylon thread, or a plastic thread. Based on operation of the sewing machine, the stitching thread causes wire 206 to be retained on a back surface of substrate 202. At 804, the position of substrate 202 is controlled with respect to the needle of the sewing machine. In an exemplary embodiment of the invention, the position of substrate 202 may be controlled by using an X-Y positioning system, which may be a computer-controlled positioning system configured for use in a precise stitching operation.

At 806, antenna pattern 204 is stitched onto substrate 202, using the sewing machine. As wire 206 is fed from the bobbin in stitching antenna pattern 204, the antenna pattern 204 incorporates wire 206. In an embodiment of the invention, antenna pattern 204 is stitched onto substrate 202 by using the sewing machine and the X-Y positioning system. Substrate 202 is stationary, and the X-Y positioning system moves the needle of the sewing machine in two dimensions to stitch antenna pattern 204 on to substrate 202. For example, Gammill Quilting Machine Company's Gammill quilting system™, a machine quilting system, may be used for stitching antenna pattern 204 on to substrate 202. The Gammill quilting system™ employs an X-Y positioning system to move the needle of the sewing machine over a stationary cloth during the stitching operation.

At 808, insulation material 208 is inserted from the interior of antenna pattern 204 to an area that is external to antenna pattern 204. Insulating material 208 helps in routing a lead of wire 206 from inside antenna pattern 204 to a position outside antenna pattern 204. At 810, insulation material 208 is stitched onto substrate 202. A length of wire 206 extends across insulating material 208 and provides a lead for antenna 200.

Various embodiments of the invention provide a method for fabricating an antenna. The method uses a sewing machine to fabricate antennas in sizes that are larger than the sizes of antennas fabricated by using existing techniques. These larger sized antennas may be used in application requiring tracking of larger working volumes in one instance. For example, in certain surgical applications larger area of a patient's body may be required to be tracked in one instance.

Various embodiments of the invention provide an antenna, which includes a flexible substrate. The flexible substrate may be easily packaged or rolled and transported. Further, these flexible substrate antennas may be rolled flat for installation. In an embodiment of the invention, the antenna includes a conformal substrate, which may be used in applications that require particular curves in the substrate.

While the invention has been described in terms of various specific embodiments, those skilled in the art will recognize that the invention can be practiced with modification within the spirit and scope of the claims.

What is claimed is:

1. A method for fabricating an antenna, said method comprising:
   pre-defining a shape of an antenna pattern wherein the antenna pattern is a spiral coil;
   stitching a wire to a pre-perforated substrate in conformation to the pre-defined shape of the antenna pattern, the
   inserting an insulating material on the antenna pattern crossing at least a portion of the antenna pattern from an interior of the spiral coil to an area external of the spiral coil; and
   stitching the insulating material onto the pre-perforated substrate, so that a portion of the wire crossing the insulating material provides a lead for the antenna externally to the spiral coil.

2. A method according to claim 1 wherein stitching an antenna pattern to a substrate comprises:
   providing a bobbin of a sewing machine with the wire; and
   stitching the antenna pattern onto the substrate using the sewing machine.

3. A method according to claim 1 wherein stitching an antenna pattern to a substrate comprises:
   providing a bobbin of a sewing machine with wire and a needle of the sewing machine with a thread; and
   stitching the antenna pattern onto the substrate using the sewing machine.

4. A method according to claim 1 wherein stitching an antenna pattern to a substrate comprises:
   controlling a position of the substrate with respect to a sewing machine needle using an X-Y positioning device; and
   stitching the antenna pattern onto the substrate using the sewing machine and the precision X-Y positioning device.

5. A method according to claim 1 wherein stitching an antenna pattern to a substrate comprises stitching a two dimensional antenna pattern onto the substrate, the two dimensional antenna pattern operable for a medical imaging system.

6. A method according to claim 1 wherein said pre-perforated substrate comprises cardboard.

7. A method according to claim 1 wherein said pre-perforated substrate comprises a ceramic.

* * * * *